United States Patent
Watanabe et al.

(10) Patent No.: US 7,030,394 B2
(45) Date of Patent: *Apr. 18, 2006

(54) CHARGED PARTICLE BEAM APPARATUS AND AUTOMATIC ASTIGMATISM ADJUSTMENT METHOD

(75) Inventors: Masahiro Watanabe, Yokohama (JP); Hiroyuki Shinada, Chofu (JP); Atsuko Takafuji, Tokyo (JP); Masami Iizuka, Ishioka (JP); Yasuhiro Gunji, Hitachioota (JP); Kouichi Hayakawa, Hitachinaka (JP); Masayoshi Takeda, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/980,096

(22) Filed: Nov. 2, 2004

(65) Prior Publication Data

US 2005/0092930 A1    May 5, 2005

Related U.S. Application Data

(63) Continuation of application No. 09/603,459, filed on Jun. 22, 2000, now Pat. No. 6,825,480.

(30) Foreign Application Priority Data

Jun. 23, 1999   (JP) .................................. 11-176681

(51) Int. Cl.
   *G01B 11/00*   (2006.01)
(52) U.S. Cl. ................... 250/491.1; 250/310; 250/311; 250/396 R; 250/396 ML
(58) Field of Classification Search ................ 250/303, 250/306, 307, 308, 309, 310, 311, 396 MC, 250/398, 492.1, 492.2, 396 R, 396 ML, 491.1
See application file for complete search history.

(56) References Cited

U.S. PATENT DOCUMENTS

| | | | | |
|---|---|---|---|---|
| 4,737,640 A | * | 4/1988 | Ohashi | ........................ 250/311 |
| 5,047,646 A | * | 9/1991 | Hattori et al. | .......... 250/396 R |
| 5,144,129 A | * | 9/1992 | Kobayashi et al. | .......... 250/307 |
| 5,302,829 A | * | 4/1994 | Komatsu et al. | ............. 250/307 |
| 5,313,062 A | * | 5/1994 | Yamada | ........................ 250/310 |
| 5,391,886 A | * | 2/1995 | Yamada et al. | ......... 250/492.22 |
| 5,396,077 A | * | 3/1995 | Sohda et al. | .............. 250/492.2 |
| 5,502,306 A | * | 3/1996 | Meisburger et al. | ......... 250/310 |
| 5,627,373 A | * | 5/1997 | Keese | ......................... 250/310 |
| 5,793,041 A | * | 8/1998 | Ogasawara et al. | .......... 250/307 |
| 6,025,600 A | * | 2/2000 | Archie et al. | ............ 250/396 R |
| 6,107,637 A | * | 8/2000 | Watanabe et al. | ......... 250/559.3 |
| 6,140,644 A | * | 10/2000 | Kawanami et al. | .......... 250/310 |

(Continued)

*Primary Examiner*—Nikita Wells
*Assistant Examiner*—David A. Vanore
(74) *Attorney, Agent, or Firm*—Townsend and Townsend and Crew LLP

(57) ABSTRACT

According to the invention, techniques for automatically adjusting for astigmatism in a charged particle beam apparatus. Embodiments according to the present invention can provide a charged particle beam apparatus and an automatic astigmatism adjustment methods capable of automatically correcting astigmatism and a focal point in a relatively short period of time by finding a plurality of astigmatism correction quantities and a focal point correction quantity in a single operation from a relatively small number of 2 dimensional images. Specific embodiments can perform such automatic focusing while minimizing damages inflicted on subject samples. Embodiments include, among others, a charged particle optical system for carrying out an inspection, a measurement and a fabrication with a relatively high degree of accuracy by using a charged particle beam.

10 Claims, 11 Drawing Sheets

U.S. PATENT DOCUMENTS 6,538,248 B1 * 3/2003 Kametani et al. ........... 250/310
6,565,812 B1 * 5/2003 Nomura et al. ............... 422/98
6,753,518 B1 * 6/2004 Watanabe et al. ........ 250/201.3
6,825,480 B1 * 11/2004 Watanabe et al. ........ 250/491.1

* cited by examiner $$p0 = \frac{d\theta(C)B + d\theta(B)C}{d\theta(C) + d\theta(B)}$$

Fig. 12
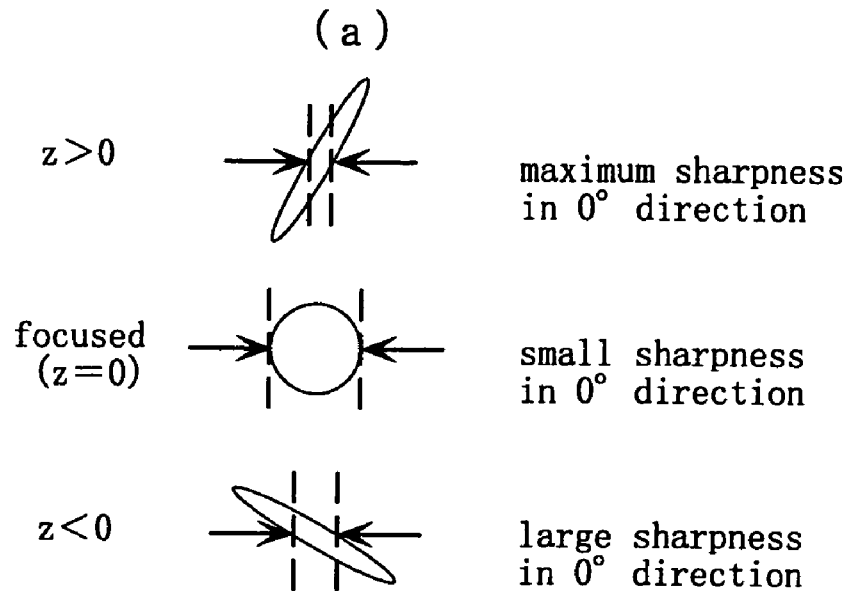
(a)
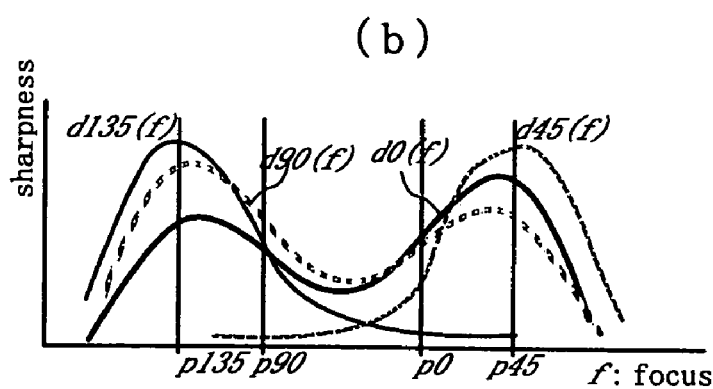
(b)
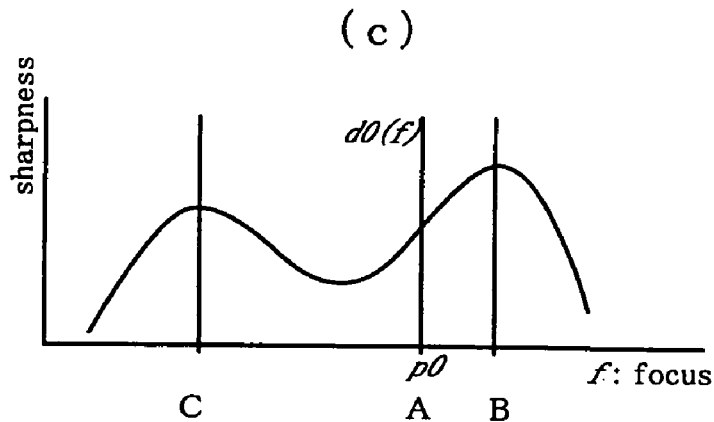
(c)

CHARGED PARTICLE BEAM APPARATUS AND AUTOMATIC ASTIGMATISM ADJUSTMENT METHOD

CROSS-REFERENCES TO RELATED APPLICATIONS

This application is a continuation of U.S. patent application Ser. No. 09/603,459, filed on Jun. 22, 2000, now U.S. Pat. No. 6,825,480, which claims priority from Japanese Patent Application No. 11-176681, filed on Jun. 23, 1999, which disclosures are incorporated by reference.

BACKGROUND OF THE INVENTION

The present invention relates generally to a charged particle beam apparatus and specifically to techniques for automatically adjusting for astigmatism.

An electron microscope is used as an automatic inspection system for inspecting and measuring a fine circuit pattern created on a substrate such as a semiconductor wafer. In the case of a defect inspection, an electron beam image detected by a scanning electron microscope is acquired and compared with a reference image used as a comparison standard. In a measurement of a hole diameter or a fine circuit pattern used in monitoring and setting a manufacturing process condition of a semiconductor device, measurement of a length is based on image processing of an electron beam image detected from the scanning electron beam microscope. In an inspection to detect a defect of a pattern by comparison of an electron beam image of the pattern with a reference image and in a measurement of a line width of a pattern by processing an electron beam image, the quality of the electron beam image greatly affects the reliability of the result of the inspection and the measurement.

The quality of an electron beam image deteriorates due to causes such as astigmatism of the electron beam system and degradation of the resolution attributed to defocusing. A poor quality electron beam image causes the inspection sensitivity and the performance of the length measurement to deteriorate. In addition, in such an image, the pattern width varies and a result of detection of an image edge can not be obtained in a relatively stable manner. In consequence, results of measuring the wire width of a pattern and the diameter of a hole with such a poor quality beam will often be unsatisfactory.

Conventionally, the focal point and the astigmatism of an electron beam optical system are adjusted by properly changing a control current of an objective lens and control currents of 2 coil sets each comprising a plurality of astigmatism correction coils while visually observing an electron beam image. To be more specific, the focal point is adjusted by varying the convergence height of a beam. The convergence height of a beam is changed by adjusting a current flowing through the objective lens.

While there are perceived advantages, it can take time to execute the conventional technique of adjusting a control current of an objective lens and control currents of 2 coil sets each comprising a plurality of astigmatism correction coils while visually observing an electron beam image as described above. In addition, the conventional techniques often require that the surface of a sample be scanned by using an electron beam several times. As a result, it is quite within the bounds of possibility that a problem of a damage inflicted on the sample arises. In addition, since in conventional systems, adjustments are often carried out manually, the result of the adjustment varies from operator to operator.

Moreover, the astigmatism and the focal position can change with time. It is thus necessary to adjust the astigmatism and the focal position periodically by manual operations in order to carry out an automatic inspection and an automatic measurement of a length.

What is needed are automated techniques for controlling electron beams.

SUMMARY OF THE INVENTION

According to the invention, techniques for automatically adjusting for astigmatism in a charged particle beam apparatus are provided. Embodiments according to the present invention can provide a charged particle beam apparatus and an automatic astigmatism adjustment methods capable of automatically correcting astigmatism and a focal point in a relatively short period of time by finding a plurality of astigmatism correction quantities and a focal point correction quantity in a single operation from a relatively small number of 2 dimensional images. Specific embodiments can perform such automatic focusing while minimizing damages inflicted on subject samples. Embodiments include, among others, a charged particle optical system for carrying out an inspection, a measurement and a fabrication with a relatively high degree of accuracy by using a charged particle beam.

Numerous benefits are achieved by way of the present invention over conventional techniques. The present invention can provide specific embodiments with the capability of automatically adjusting astigmatism and a focal point at a relatively high speed and with a relatively high degree of precision by using a small number of particle images obtained as a result of radiation of a converged charged particle beam to a sample in a scanning operation without inflicting a damage on the sample. In addition, select embodiments according to the present invention can also provide the capability of carrying out an automatic inspection of a pattern defect, such as a foreign substance on an object substrate, or an automatic measurement of dimensions of a pattern on the object substance. In specific embodiments, such tasks can be carried out with a relatively high degree of precision while sustaining the quality of a particle image in a relatively stable manner over a relatively long period of time by using the particle image. The particle image is obtained as a result of radiation of a converged charged particle beam while adjusting astigmatism and focal point thereof automatically and at a relatively high speed and with a relatively high degree of precision.

Select embodiments according to the present invention can provide a charged particle beam apparatus and an automatic astigmatism adjustment method capable of automatically correcting astigmatism in a relatively short period of time for a variety of samples. Such embodiments according to the invention can find a plurality of astigmatism correction quantities at the same time from a small number of 2 dimensional images. In specific embodiments, damage inflicted on samples can be kept to a minimum.

Furthermore, some specific embodiments according to the present invention can provide a charged particle beam apparatus capable of carrying out inspections, measurements and fabrications with a relatively high degree of reliability and in a relatively stable manner over a relatively long period of time. The quality of a charge particle image obtained from an object substrate as a result of automatic correction of astigmatism and a focal point of a charged particle beam optical system is improved in some embodiments.

Moreover, many specific embodiments according to the present invention can provide a sample used for an adjustment of astigmatism and a focal point of a charged particle beam and suitable for an automatic correction of the astigmatism and the focal point in a relatively short period of time by suppressing damages inflicted on the sample to a minimum in a charged particle beam optical system.

Yet further, some specific embodiments according to the present invention can provide an automatic astigmatism adjustment method capable of automatically correcting astigmatism and a focal point in a relatively short period of time from a 2 dimensional particle image and to provide a sample for the method.

These and other benefits are described throughout the present specification. A further understanding of the nature and advantages of the invention herein may be realized by reference to the remaining portions of the specification and the attached drawings.

BRIEF DESCRIPTION OF THE DRAWINGS

FIG. 12 illustrates an explanatory diagram showing a case in which a curve representing the directional sharpness magnitude exhibits a double peaked characteristic in a particular embodiment according to the present invention;

DESCRIPTION OF THE SPECIFIC EMBODIMENTS

Figure 1:
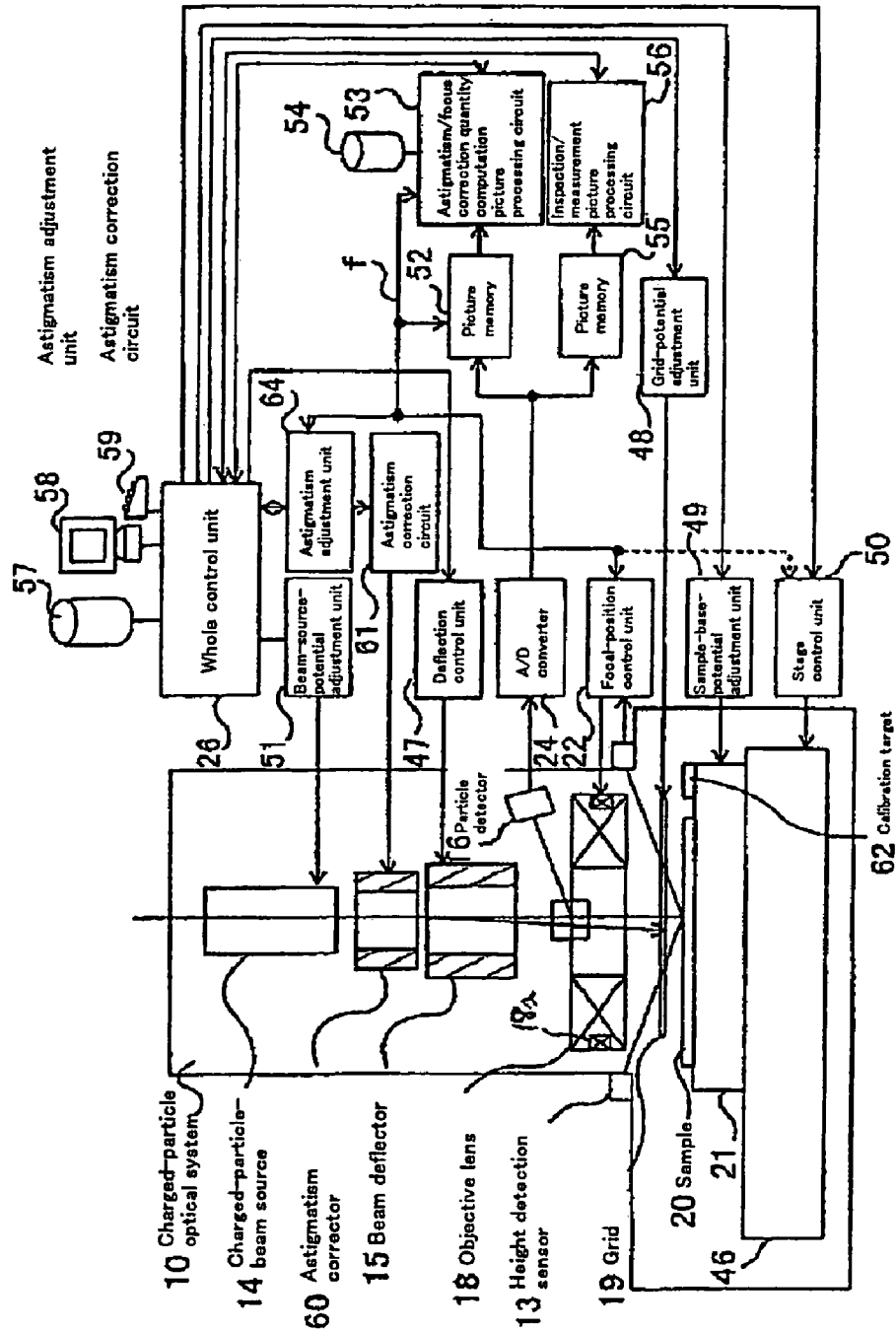
FIG. 1 illustrates a diagram showing a representative configuration of an inspection and measurement apparatus in an example charged particle beam apparatus provided by a particular embodiment of the present invention.

The present invention provides techniques for automatically adjusting for astigmatism in charged particle beam apparatus. Embodiments according to the present invention can provide a charged particle beam apparatus and automatic astigmatism adjustment techniques capable of automatically correcting astigmatism, as well as focal point, in a relatively short period of time. Embodiments can find a plurality of astigmatism correction quantities and a focal point correction quantity in a single operation from a relatively small number of 2 dimensional images.

A variety of automatic astigmatism correction techniques have been proposed. According to one technique, a secondary electron signal obtained from a sample as a result of 2 dimensional scanning over the sample by using a charged particle beam is differentiated to extract digital data with a large variation. Then, a position on the sample corresponding to the extracted digital data is found. The charged particle beam is then used for scanning the sample only in the X and Y directions with the found position taken as a center while an excitation current flowing through the an objective lens is being changed. Then, focal information in the X direction and focal information in the Y direction are detected at a maximum value of the digital data of the secondary electron signal obtained as a result of the scanning in each of these directions. From the focal information in the X direction and the focal information in the Y direction, the magnitude of a current flowing through the objective lens is determined and the current of the determined magnitude is output to the objective lens. Later, a current flowing through an astigmatism correction coil is changed and a charged particle beam is used for scanning in one direction, namely, the X or Y direction, and the magnitude of the current flowing through the astigmatism correction coil is determined at a maximum value of the digital data of a secondary electron signal obtained as a result of the scanning to adjust the focus and the astigmatism of the output charged particle beam. For a more detailed description of such techniques, reference may be had to a Japanese Patent Prepublication No. Hei 7-153407.

According to another technique, while an electron beam is being used in scanning in a variety of directions, a focal point is vibrated to find the direction of astigmatism. Then, while a relation between 2 astigmatism quantities of different types is being sustained so that the astigmatism changes only in a particular direction, the astigmatism quantities are changed to search for a condition producing a clear image. Thus, conditions of the astigmatism quantities of 2 freedoms can be adjusted by limiting the quantities to 1 freedom, allowing the adjustment time to be shortened. For a more detailed description of such techniques, reference may be had to a Japanese Patent Prepublication No. Hei 9-161706.

In a yet further technique, after a focal point is adjusted automatically to make a shift from an in focus state to a state slightly shifted away from the in focus state. Then, the direction of astigmatism is found by applying FFT to a 2 dimensional image. Then, while a relation between 2 astigmatism quantities of different types is being sustained so that the astigmatism changes only in this direction, the astigmatism quantities are changed to search for a condition producing a clear image. For a more detailed description of such techniques, reference may be had to a Japanese Patent Prepublication No. Hei 10-106469.

In a still yet further technique, a point at which a change of a Fourier transformation quantity is inverted is found by changing the focal point by application of Fourier transformation of a 2 dimensional image. Then, a secondary electron image at a focal point before an in focus state and a secondary electron image at a focal point after the in focus state are measured. The direction of astigmatism is then found from distributions of the maximums and the minimums. Then, the astigmatism is corrected so that the astigmatism changes in this direction. For a more detailed description of such techniques, reference may be had to a in Japanese Patent Prepublication No. Hei 9-82257.

In a still yet further technique, an astigmatism correction quantity can be determined using sharpness magnitudes in 4 directions of scanning electron microscope images acquired by increasing the position of the focal point are found. Then, the position of the focal point is further increased till a maximum value of each of the sharpness magnitudes is obtained. Finally, the astigmatism correction quantity is found from the maximum values of the sharpness magnitudes in these 4 directions. By using this technique, an astigmatism correction quantity can be found from a series of scanning electron microscope images with their focal points shifted from each other. In this technique, however, maximum values of sharpness magnitudes are used and whole changes in sharpness magnitude are not taken into consideration. For a more detailed description of such techniques, reference may be had to U.S. Pat. Ser. No. 6,025, 600.

Techniques that find a point at which the sharpness of a particle image reaches a maximum by using a trial and error technique while changing a total of 3 control quantities, namely, 2 astigmatism correction quantities of different types and a focal point correction quantity, can takes a relatively long time to complete the correction process. If this occurs, a charged particle beam is radiated to the sample for a long time, resulting in damage to the sample due to electric charge and dirt accumulated in the sample. In addition, when an automatic or visual adjustment is carried out by using the sharpness as a measure, there is more likely a case in which a condition can not be set to make astigmatism truly disappear in dependence on a pattern on the sample.

Techniques that find a direction of astigmatism by vibrating the focal point, and then perform a 1 dimensional scanning operation repeatedly by vibrating the focal point while the astigmatism correction quantity is being changed, may necessitate repeatedly carrying out an operation to search for a condition in which focal points in 2 directions coincide with each other, raising a problem that it takes time to repeatedly carry out such an operation. In addition, a 1 dimensional scanning operations performed on a sample can leave a radiation mark on the sample. Furthermore, there is also raised a problem of stability in the correction of the astigmatism due to the fact that a signal with a sufficient strength can not be obtained from some locations experiencing a 1 dimensional scanning operation because of non uniform texture on the sample.

Techniques in which a 2 step adjustment is carried out in order to vibrate an astigmatism correction quantity after a focal point is vibrated raise a issue of a long time to complete the adjustment. Also, an issue of severe damages inflicted on the sample can arise. In addition, the processing to find the direction of astigmatism by using the FFT can require a presumption of a uniform spectrum of an image obtained with no astigmatism generated, imposing a limitation on usable samples.

Many techniques do not determine a direction and a magnitude of astigmatism from a particle image in a relatively stable manner, nor compute a correction quantity from the direction and the magnitude of astigmatism to be adopted in an astigmatism adjustment device. Thus, the astigmatism correction quantity may need to be changed, which can necessitate the correction quantity be examined repeatedly on a trial and error basis. As a result, it takes time to carry out the adjustment and, damage can be inflicted on the sample due to contamination and buildup of a charge on the sample. Furthermore, precision deterioration can occur for a location on the sample with a coarse pattern scanned in a 1 dimensional scanning operation.

Techniques in which the direction and the "strength" of astigmatism are found by applying Fourier transformation to a 2 dimensional image with a vibrating focal point, may not be able to find a correction quantity for an astigmatism adjustment device from the direction and the "strength" of astigmatism. There is thus raised a problem of an inability to find a correction quantity for the astigmatism adjustment means with a sufficiently high degree of accuracy.

Techniques that determine an astigmatism correction quantity using sharpness magnitudes in 4 directions can fail to find the correction quantity in instances where the curve representing the changes in sharpness magnitude is an asymmetrical or has a double peaked character. In addition, an astigmatism correction quantity may not always be found from a series of scanning electron microscope images with their focal points shifted from each other with a relatively high degree of accuracy. This is especially true in cases were the sharpness curve tends to be asymmetric or have double peaks, or when the astigmatism is large.

In order to solve the problems of prior art techniques, such as an increased number of errors generated in correction of astigmatism due to the use of maximum values of directional sharpness magnitudes in an analysis of the directional sharpness magnitudes, embodiments according to the present invention provide techniques for finding a center of gravity of a curve representing the directional sharpness magnitude. Techniques based on a center of gravity can correct the center position of an area under a asymmetrical or doubled peaked curve representing the directional sharpness magnitude toward a region with a wider base in the case of the asymmetrical curve or a region including the auxiliary hump in the case of the double peaked curve. As a result, the astigmatism can be corrected relatively surely as well as relatively accurately.

Astigmatism correction quantities can include error due to an effect of aberration other than astigmatism of the charged particle optical system. Thus, if the magnitude of astigmatism is large, the astigmatism is corrected repeatedly a plurality of times if necessary till the change in astigmatism correction quantity is reduced or converged to a small value. By this way, the failure in correcting astigmatism can be prevented.

Specific embodiments of the present invention that implement a charged particle beam apparatus, automatic astigmatism correction techniques and samples for adjustments of astigmatism of a charged particle beam are explained by referring to diagrams.

FIG. 1 illustrates an inspection and measurement apparatus in a charged particle beam apparatus in a particular embodiment according to the present invention. FIG. 1 illustrates a charged particle optical system 10, a control system for controlling a variety of elements comprising the charged particle optical system 10 and an image processing system for processing an image on the basis of secondary particles or reflected particles detected by a particle detector 16 in the charged particle optical system 10.

The charged particle optical system 10 comprises a charged particle beam source 14 for emitting a charged particle beam such an electron beam or an ion beam and an astigmatism corrector 60 for correcting astigmatism of a charged particle beam emitted by the charged particle beam source 14 by providing an electric field. Further, a beam deflector 15 for deflecting the charged particle beam emitted by the charged particle beam source 14 in a scanning operation can also be part of charged particle optical system 10. An objective lens 18 for converging the charged particle beam deflected by the beam deflector 15 by means of a magnetic field; a sample base 21 for mounting a sample 20 and fixing a calibration target 62 beside the sample 20; an XY stage 46 for mounting and moving the sample base 21; a grid electrode 19 set at an electric potential close to that of the ground can also be included in system 10. Further, a retarding electrode (not shown in the figure) can be used for providing a negative electric potential relative to the sample 20 and the calibration target 62 mounted on the sample base 21 to an electron beam radiated by the charged particle beam source 14 as a charged particle beam or a positive electric potential relative to the sample 20 and the calibration target 62 to an ion beam radiated by the charged particle beam source 14 as a charged particle beam. FIG. 1 also illustrates a height detection sensor 13 for measuring the height of the sample 20 or another object; and the particle detector 16 for detecting secondary particles or reflected particles which emanate from the surface of the sample 20 as a result of radiation of a charged particle beam to the sample 20 and are reflected typically by a reflective plate.

It should be noted that the astigmatism corrector 60 can be implemented by an astigmatism correction coil based on a magnetic field or an astigmatism correction electrode based on an electric field. The objective lens 18 can be implemented by an objective coil based on a magnetic field or a static objective lens based on an electric field. In addition, the objective lens 18 can also be provided with a coil 18a for correction of the focal point. An astigmatism adjustment means comprises the astigmatism corrector 60 and an astigmatism correction circuit 61.

A stage control unit 50 drives and controls the movement or the travel motion of the XY stage 46 while monitoring the position or the displacement of the XY stage 46 on the basis of a control command issued by a whole control unit 26. It should be noted that the XY stage 46 is provided with a position monitoring length measurement unit for monitoring the position or the displacement of the XY stage 46. The monitored position or displacement of the XY stage 46 can be supplied to the whole control unit 26 through the stage control unit 50.

A focal position control unit 22 drives and controls the objective lens 18 in order to adjust the focal point of the charged particle beam to a position on the sample 20 on the basis of height information of the surface of the sample 20 measured by a height detection sensor 13 in accordance with a command issued by the whole control unit 26. It should be noted that, by adding a Z stage to the XY stage 46, the focal point can be adjusted by driving and controlling the Z stage in place of the objective lens 18. The objective lens 18 or the Z stage, the focal position control unit 22 and other components constitute a focus point control means.

A deflection control unit 47 supplies a deflection signal to the beam deflector 15 in accordance with a control command issued by the whole control unit 26. At that time, a correction is added to the deflection signal so as to compensate for a variation in image magnification accompanying a change in surface height of the sample 20 and for an image rotation accompanying control of the objective lens 18.

A grid potential adjustment unit 48 adjusts the close to the ground electric potential applied to the grid electrode 19 provided at a position above and close to the sample 20 in accordance with a potential adjustment command issued by the whole control unit 26. A sample base potential adjustment unit 49 adjusts an electric potential applied to the retarding electrode provided above the sample base 21 in accordance with a potential adjustment command issued by the whole control unit 26. A negative or positive electric potential applied to the sample 20 by the grid electrode 19 and the retarding electrode reduces the velocity of an electron beam or an ion beam traveling between the objective lens 18 and the sample 20 in order to raise the resolution in a low acceleration voltage area.

A beam source potential adjustment unit 51 adjusts an electric potential applied to the charged particle beam source 14 in accordance with a command issued by the whole control unit 26 to regulate a beam current or an acceleration voltage of a charged particle beam emitted by the charged particle beam source 14.

The beam source potential adjustment unit 51, the grid potential adjustment unit 48 and the sample base potential adjustment unit 49 are controlled by the whole control unit 26 so that a particle image with a desired quality can be detected by the particle detector 16.

Figure 4:
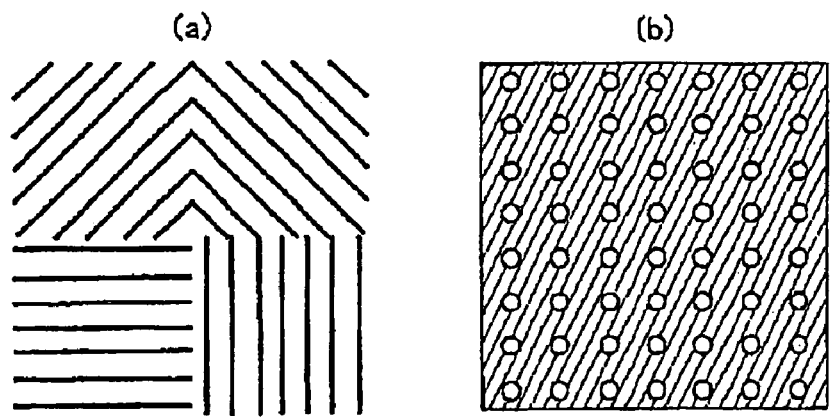
FIG. 4 illustrates a diagram showing representative patterns used for correcting astigmatism and a focal point in a particular embodiment of the present invention.

In processing to correct astigmatism and a focal point, an astigmatism adjustment unit 64 provided by the present invention issues a control command to change the focal point (also referred to as a focus f) to the focal position control unit 22. Receiving this command, the focal position control unit 22 drives and controls the objective lens 18 so as to change the focus f of a charged particle beam radiated to an area on the sample 20 or the calibration target 62 with a certain pattern created therein. The pattern typically includes edge components of about the same quantity in directions shown in FIGS. 4(a) and (b). By doing so, the particle detector 16 detects a plurality of particle image signals with different loci f. Each of the particle image signals is converted by an A/D converter 24 into a particle digital image signal or digital image data to be stored in an image memory 52, being associated with a respective focus command value f output by the astigmatism adjustment unit 64. Then, an astigmatism and focus correction quantity computation image processing circuit 53 reads out the particle digital image signals with different foci f from the image memory 52, finding directional sharpness magnitudes d0 (f), d 45 (f), d90 (f) and d135 (f) for each of the particle digital image signals. The astigmatism and focus correction quantity computation image processing circuit 53 then finds focus values f0, f45, f90 and f135 that generate peak values of the directional sharpness magnitudes d0 (f), d 45 (f), d90 (f) and d135 (f) respectively. Then, the astigmatism and focus correction quantity computation image processing circuit 53 finds the astigmatism (to be more specific, an astigmatism vector (dx and dy) or an astigmatism direction α and an astigmatism magnitude δ) and a focal offset value z from the focus values f0, f45, f90 and f45, supplying the astigmatism and the focal offset value z to the whole control unit 26 to be stored in a storage unit 57. From a relation between the astigmatism and the astigmatism correction quantity found in advance, the whole control unit 26 computes astigmatism correction quantities Δstx and Δsty for the astigmatism which is found as described above and stored in the storage unit 57. It should be noted that the relation between the astigmatism and the astigmatism correction quantity represents a characteristic of the astigmatism corrector 60. By the same token, from a relation representing a characteristic of the objective lens 18 found in advance, the whole control unit 26 computes a focal point correction quantity for the focal offset value z found as described above and stored in the storage unit 57. The astigmatism correction quantities Δstx and Δsty and the focal point correction quantity found in this way are supplied to the astigmatism adjustment unit 64.

The astigmatism adjustment unit 64 passes on the astigmatism correction quantities Δstx and Δsty received from the whole control unit 26 to the astigmatism adjustment circuit 61 so as to allow the astigmatism corrector 60 to correct the astigmatism of the charged particle beam. The astigmatism corrector 60 is an astigmatism correction coil based on a magnetic field or an astigmatism correction electrode based on an electric field. By the same token, the astigmatism adjustment unit 64 passes on the focal point correction quantity to the focal position control unit 22 to control a coil current flowing to the objective lens 18 or a coil current flowing to a focal point correction coil 18a. As a result, the focal point is corrected.

As another technique, the XY stage 46 is provided with a Z stage as described above. In this case, the astigmatism adjustment unit 64 outputs a control command to vibrate the focal point or to change the focus to the stage control unit 50 through the whole control unit 26 or directly. Receiving this command, the stage control unit 50 vibrates the focal point by driving a Z shaft of the XY stage 46. Thus, a particle image with a vibrating focal point is obtained from the particle detector 16. In the astigmatism and focus correction quantity computation image processing circuit 53, astigmatism and focal point correction quantities are found and the computed focal point correction quantity is fed back to the Z shaft of the XY stage 46 to allow a correction to be carried out. Of course, a component for acquiring an image with a vibrating focal point and a component subjected to the final focal point correction can be provided separately. To put it concretely, one of them is implemented by the focal position control unit 22 while the other is implemented by the Z shaft of the XY stage 46. As another alternative, the two components are combined to execute control by using both at the same time. In either case, the focal position relative to the location of the sample 20 or the calibration target 62 needs to be controlled to a desired distance. It should be noted that the technique of controlling the objective lens 18 offers a response characteristic superior to that of the technique of controlling the Z shaft in at least one specific embodiment.

As described above, the correction of the astigmatism and the focal point is based on control executed by the astigmatism adjustment unit 64 in accordance with a command issued by the whole control unit 26. As a result, the whole control unit 26 receives a particle image with the astigmatism and the focal point thereof corrected from the image memory 52 directly or through the astigmatism and focus correction quantity computation image processing circuit 53 and displays the particle image on a display means 58 to allow the user to visually form a judgment as to whether the correction of the astigmatism and the like is correct or incorrect.

Furthermore, in an inspection or a measurement, the XY stage 46 is controlled to take a predetermined position on the sample 20 to the visual field of the charged particle optical system. Then, a particle image signal obtained by the particle detector 16 is converted by the A/D converter 24 into a particle digital image which is then stored in an image memory 55. Subsequently, an inspection and measurement image processing circuit 56 measures dimensions of a fine pattern created on the sample 20 or inspects the sample 20 for a defect of a fine pattern or a defect such as an infinitesimal foreign material on the basis of a detected particle digital image signal stored in the image memory 55. Results of the measurement and the inspection are supplied to the whole control unit 26. At that time, by correcting the astigmatism and the focal point in accordance with the technique provided by the present invention at least periodically, it is possible to implement a measurement and an inspection based on a particle image with the astigmatism always corrected.

It should be noted that, in an inspection of a defect or the like based on a particle image, the inspection and measurement image processing circuit 56 may generate a reference particle digital image signal to be used as a comparison object by delaying a detected detection particle digital image signal and then comparing a current detection particle digital image signal with the reference particle digital image at a position corresponding to that of the current detection particle digital image signal to detect a mismatch or a difference between the 2 signals as a defect candidate. Then, the inspection and measurement image processing circuit 56 carries out processing to recognize a characteristic quantity of each defect candidate and form a judgment as to whether or not to eliminate false information from characteristic quantities in order to inspect the sample 20 for a real defect.

Slightly affected by things such as electrical charge and dirt accumulated on the sample 20 and damage inflicted on the sample 20, the optical height detection sensor 13 is capable of detecting variations in height of the sample 20 at positions being measured or inspected. The variations are fed back to the focal position control unit 22 so that an in focus state can be sustained all the time. When the optical height detection sensor 13 is used in this way, the astigmatism and the focal position can be automatically adjusted at another position on the sample 20 or at the calibration target 62 provided on the sample base 21 in advance or periodically in the course of a measurement or an inspection. Thus, radiation of a converged charged particle beam for an automatic adjustment of the astigmatism and the focal point can be omitted or reduced considerably, allowing effects of electric charge and dirt accumulated on the sample 20 and a damage inflicted on the sample 20 to be eliminated.

The following description explains automatic adjustment of the astigmatism and the focal point in a converged charged particle optical system provided by a specific embodiment according to the present invention. In this specific embodiment according to the present invention, the amount of astigmatism and the focal offset are found from a small number of 2 dimensional particle images. The amount of astigmatism and the focal offset are then converted into correction quantities of the astigmatism and the focal offset respectively at the same time in a one time correction process.

Figure 2:
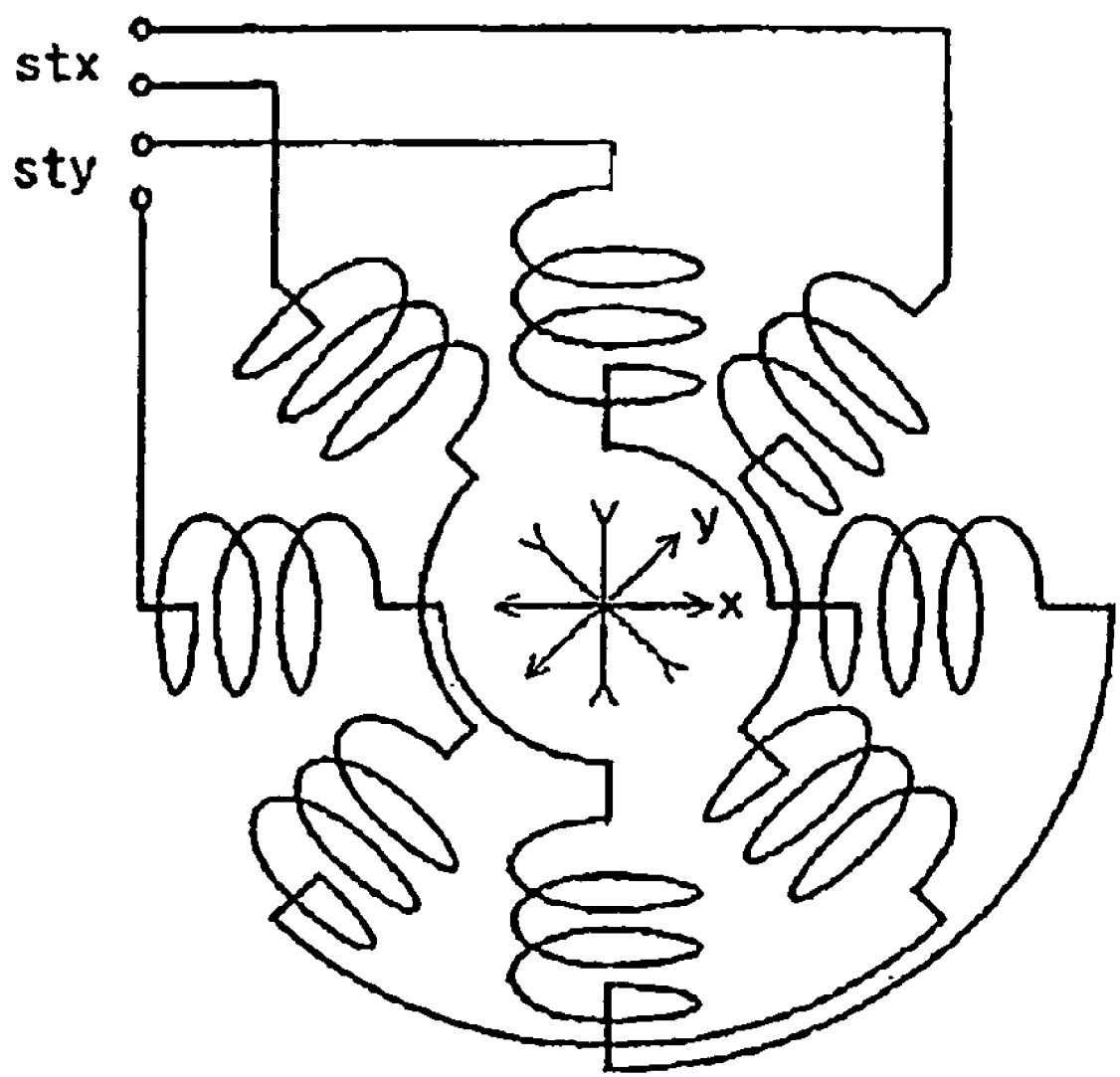
FIG. 2 illustrates an explanatory diagram showing astigmatism correction coils in a particular embodiment according to the present invention.

FIG. 2 is a diagram showing a configuration of 2 coil sets each comprising a plurality of coils. Based on magnetic fields, these 2 coil sets serve as an embodiment of the astigmatism corrector 60. In the configuration of the 2 coil sets each comprising a plurality of astigmatism correction coils, a current flowing through one of the coil sets has an effect of expanding a beam in a certain direction while shrinking the beam in a direction perpendicular to the certain direction. If the 2 coil sets are controlled respectively by a combination of 2 magnetic fields stx and sty shifted from each other by a phase difference of 45 degrees as shown in FIG. 2, the astigmatism can be adjusted in any arbitrary direction by a necessary amount. Of course, the astigmatism corrector 60 can also be designed to comprise electrodes based on magnetic fields.

Figure 3:
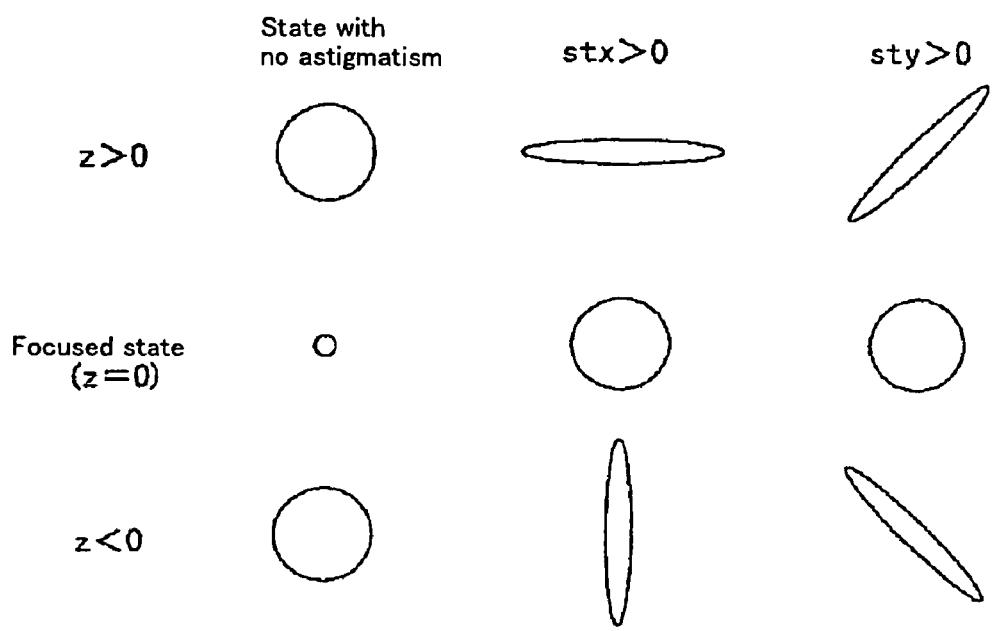
FIG. 3 illustrates a diagram showing a relation of astigmatism and shapes of a beam spot.

Next, states of astigmatism are explained by referring to FIG. 3. A column on the left side represents states of converged charged particle beams with astigmatism thereof corrected. A state on the top of a column is a case with a high focal position (Z>0). A state in the middle of a column represents an in focus state (Z=0). A state at the bottom of a column is a case with a low focal position (Z<0). As indicated by the column on the left side, at the in focus position, the charged particle beam is converged on a small point. At positions above and below the in focus position, the diameter of the beam increases symmetrically with respect to the in focus position. The column in the middle of FIG. 3 represents states obtained as a result of flowing an stx current. For Z>0, the beam is expanded in the horizontal direction. For Z<0, on the other hand, the beam is expanded in the vertical direction. At the in focus position, the beam forms a true circle but the diameter of the circle is not reduced to a sufficiently small value. The column on the right side of FIG. 3 represents states obtained as a result of flowing an sty current. At the positions shifted from the in focus position, the orientation of elliptical beam is rotated by 45 degrees in directions opposite to each other so that the direction of the major axis of the ellipse for Z>0 is perpendicular to that for Z<0. By combining an stx current with an sty current, astigmatism of any arbitrary direction can be generated in any arbitrary direction so as to cancel preadjustment astigmatism of the charged particle optical system. As a result, the astigmatism can be corrected.

Figure 6:
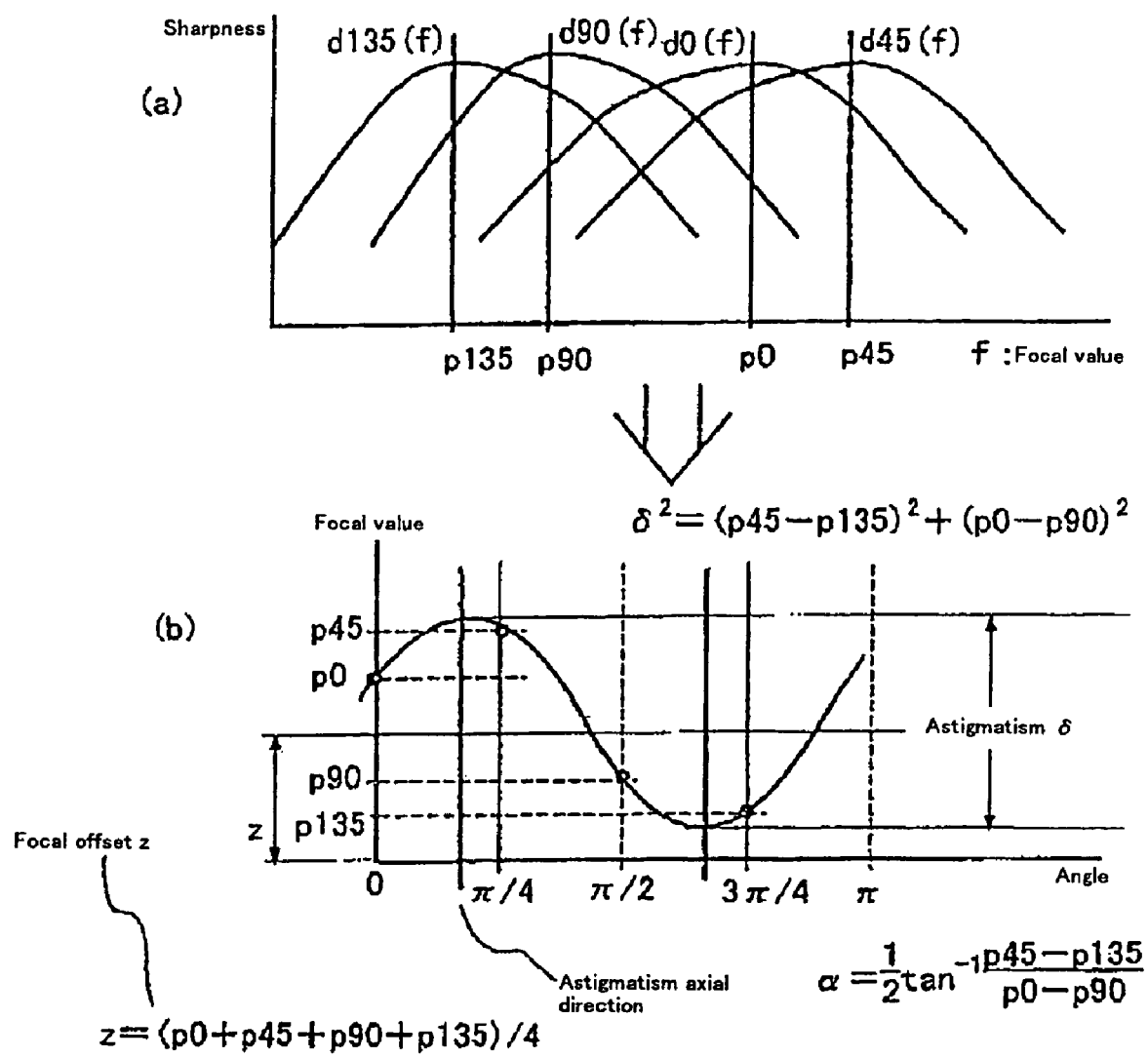
FIG. 6 illustrates diagram showing a relation among a computed directional sharpness magnitude, an astigmatism magnitude, an astigmatism direction and a focal offset z.
Figure 7:
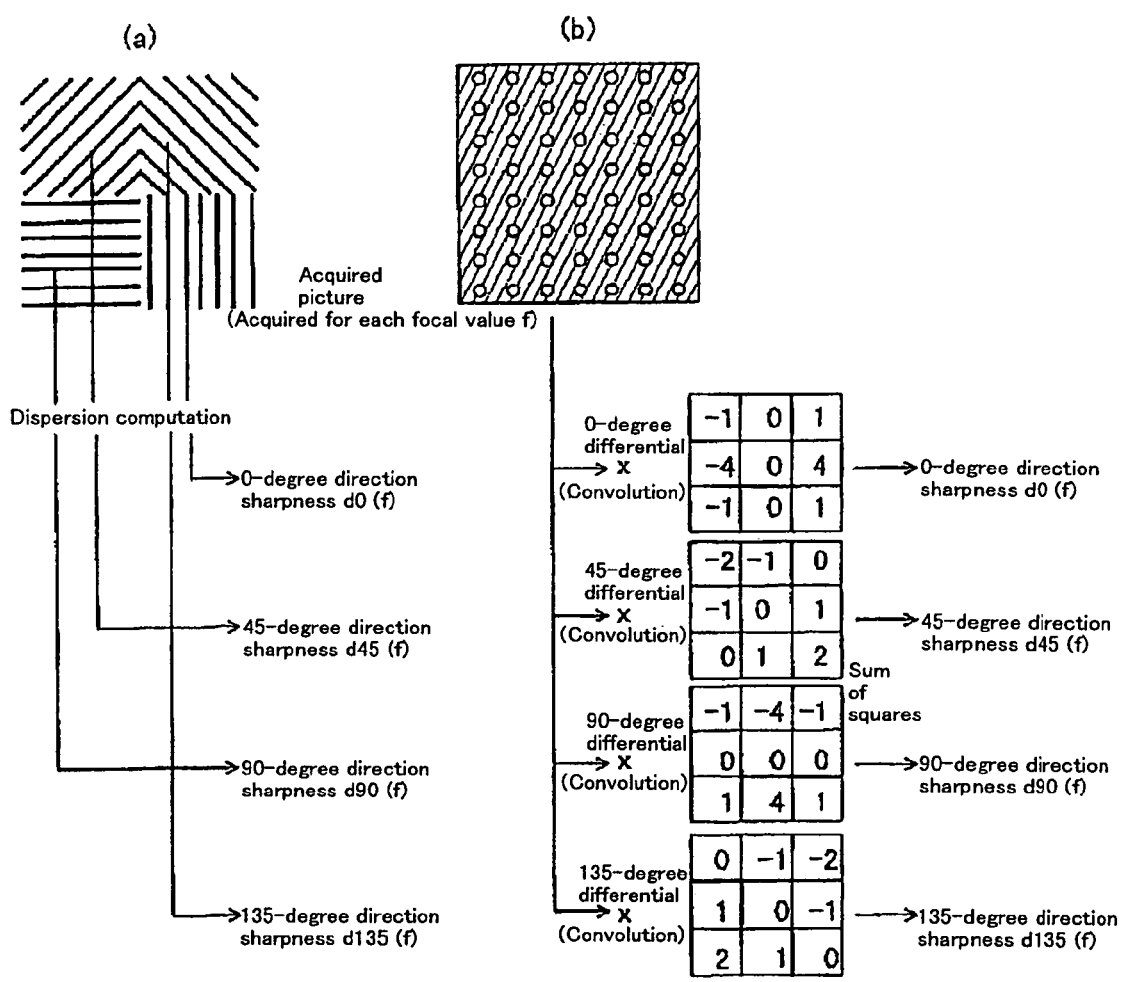
FIG. 7 illustrates a diagram showing representative image processing in order to find directional sharpness magnitudes in a particular embodiment according to the present invention.

As shown in FIG. 3, in a state with generated astigmatism, at a position shifted from the in focus position, the charged particle beam blurs into an elliptical shape. To be more specific, at +Z and −Z positions sandwiching the focal point, the elliptical shapes of the beam are thinnest and the major axes of the ellipses are oriented in directions perpendicular to each other. The magnitude of the astigmatism is represented by the focal distance 2Z between the 2 shifted points and the direction of the astigmatism is represented by the direction of the ellipse. The focal distance 2Z between the 2 shifted points is referred to astigmatism which is denoted by notation δ shown in FIG. 6. On the other hand, the direction of the astigmatism is represented by a main point main axis direction α shown in FIG. 6. An astigmatism vector can be denoted by notation (dx, dy).

Next, correction of the astigmatism and the focal point is explained by referring to FIGS. 4 to 7. FIGS. 4(a) and (b) are diagrams each showing an embodiment of a pattern created on the sample 20 or the calibration target 62 and used for correction of the astigmatism and the focal point. Any pattern can be used as a pattern for correction of the astigmatism and the focal point as long as the pattern includes edge components of about the same quantity in at least 3 directions in which astigmatism is generated. FIG. 4(a) shows an embodiment with 4 patterns of straight lines created in different areas. The direction of the straight lines varies from pattern to pattern. On the other hand, FIG. 4(b) shows curve shaped patterns which have edge components in 4 directions and are laid out 2 dimensionally at a uniform pitch. In the case of the sample 20, in particular, a pattern created thereon to include edge components of about the same quantity in at least 3 directions is usable. In this case, however, it is necessary to supply information on a position to create this pattern to the whole control unit 26 in advance by using an input means 59 and store the information typically in the storage unit 57, or it is necessary for the operator to specify a position on the sample 20 for each correction of the astigmatism and the focal position. In addition, it is a matter of course that information on a position to install the calibration target 62 on the sample base 21 is supplied to the whole control unit 26 in advance by using the input means 59 and stored in the storage unit 57 in advance.

The whole control unit 26 supplies the information on a position of a pattern for correction of the astigmatism and the focal point to the stage controller 50. In accordance with the information, the stage controller 50 drives and controls the XY stage 46 to move the pattern for correction of the astigmatism and the focal point to a position in close proximity to an optical axis of the charged particle optical system.

Figure 5:
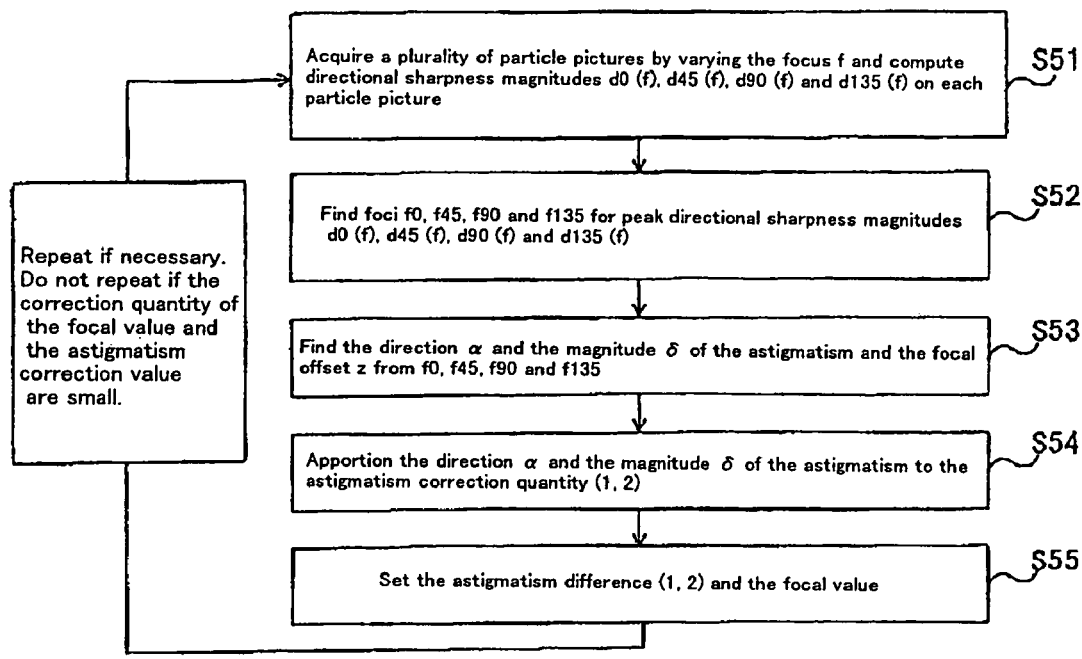
FIG. 5 illustrates a flowchart of representative image processing executed by an astigmatism and focal point correction quantity computation circuit in a particular embodiment according to the present invention.

(1) At a step S51 of a flowchart shown in FIG. 5, while the charged particle beam is being radiated to the pattern for correction of the astigmatism and the focal point in a scanning operation in accordance with a command issued by the whole control unit 26 to the deflection control unit 47 and the focus f is being changed in accordance with a command issued by the astigmatism adjustment unit 64 to the focal position control unit 22, the particle detector 16 acquires a plurality of images and stores them in the image memory 52. The astigmatism and focus correction quantity computation image processing circuit 53 computes directional sharpness magnitudes (at 0 degrees, 45 degrees, 90 degrees and 135 degrees) as d0 (f), d45 (f), d90 (f) and d135 (f) respectively as shown in FIG. 6(a). It should be noted that it is possible to acquire a focus f as a value specified in a command issued by the astigmatism adjustment unit 64 to the focal position control unit 22.

(2) At a next step S52, the astigmatism and focus correction quantity computation image processing circuit 53 finds center positions p0, p45, p90 and p135 shown in FIG. 6(a) for each curve representing the 4 directional sharpness magnitudes as a function of focus f in one of the directions.

(3) At a next step S53, the astigmatism and focus correction quantity computation image processing circuit 53 finds the direction α and the magnitude δ of a focal shift (or astigmatism) caused by directional astigmatism from the center positions p0, p45, p90 and p135 on the basis of a sinusoidal function shown in FIG. 6(b). The astigmatism and focus correction quantity computation image processing circuit 53 also finds the focal offset z. The astigmatism direction α, the astigmatism magnitude δ and the focal offset z are supplied to the whole control unit 26 to be stored in the storage unit 57. It should be noted that, at the step S53, the astigmatism vector (dx, dy) can also be found in place of the direction α and the magnitude δ of the astigmatism. The magnitude δ of the astigmatism can be expressed by Eq. (1) given below. On the other hand, the direction α of the astigmatism can be expressed by Eq. (2) given below. As for the focal offset z, Eq. (3) given below is applicable.

$$\delta^2 = (p0-p90)^2 + (p45-p135)^2 = (dx)^2 + (dy)^2 \qquad (1)$$

$$\alpha = (1/2)\tan^{-1}((p45-p135)/(p0-p90))$$
$$= (1/2)\tan^{-1}((dy)/(dx)) \qquad (2)$$

$$z = (p0+p45+p90+p135)/4 \qquad (3)$$

It should be noted that the storage unit 54 is used for storing software including a program for finding the directional sharpness magnitudes d0 (f), d45 (f), d90 (f) and d135 (f) described above, a program for finding their center positions p0, p45, p90 and p135 from the directional sharpness magnitudes d0 (f), d45 (f), d90 (f) and d135 (f) respectively and a program for finding the astigmatism and the focal offset. The astigmatism and focus correction quantity computation image processing circuit 53 has a configuration capable of carrying out processing based on these programs. Of course, the storage unit 54 can be implemented as a ROM or the like.

(4) At a next step S54, the whole control unit 26 becomes capable of converting or apportioning astigmatism (α and δ or (dx, dy)) into or to required astigmatism correction quantities (1, 2) (Δstx, Δsty) by using a relation between variations in astigmatism control values (stx, sty) and variation quantities (or sensitivities) in astigmatism direction α and astigmatism magnitude δ or in astigmatism vector (dx, dy). This relation is a characteristic of the astigmatism corrector 60 which is found in advance. At the next step S55, the whole control unit 26 becomes capable of setting the astigmatism correction quantities (1, 2) (Δstx, Δsty) and the focal offset value z to be supplied to the astigmatism adjustment unit 64. It should be noted that the astigmatism correction quantities (1, 2) (Δstx, Δsty) and the focal value z may be computed by the astigmatism and focus correction quantity computation image processing circuit 53, which receives the characteristics of the astigmatism corrector 60 and the objective lens 18 from the whole control unit 26 instead of being computed directly by the whole control unit 26.

(5) The astigmatism adjustment unit 64 supplies the focal offset value z received from the whole control unit 26 to the focal position control unit 22, which corrects an objective lens current flowing through the objective lens 18 or a focus correction coil current flowing through the focal point correction coil 18a. The astigmatism adjustment unit 64 also supplies the astigmatism correction quantities (Δstx, Δsty) received from the whole control unit 26 to an astigmatism correction circuit 61, which corrects an astigmatism correction coil current or an astigmatism correction static voltage. In this way, the correction of the astigmatism and the adjustment of the focal point can be carried out in a one time operation.

(6) In the case of a small amount of astigmatism, auto stigma processing is completed in the one time operation described above. In the case of a large amount of astigmatism, on the other hand, the processing can not be completed in a one time operation due to causes of aberration other than the astigmatism. Examples of aberration other than the astigmatism are high order astigmatism and image distortion. In this case, the flow of the procedure goes back to (1) to carry out the auto stigma processing once again. The loop is executed repeatedly till the focal offset z and the astigmatism correction quantities (Δstx, Δsty) are reduced to small values.

By adopting the technique described above, the astigmatism and the focal point can be adjusted at a relatively high speed in a one time operation with only few small damages inflicted on the sample 20 and the calibration target 62. In addition, while the focal point is being changed, the directional sharpness magnitudes of images of the same sample 20 or the same calibration target 62 are compared with each other to find astigmatism. Thus, the astigmatism and the focal point can be adjusted with a relatively high degree of precision in a one time operation without relying on a pattern on the sample 20 or the calibration target 62, that is, a pattern for correction of the astigmatism and the focal point. The only requirement for a pattern created on the sample 20 or the calibration target 62 is that the pattern must include edge components of about the same quantity in each direction.

As described above, directional astigmatism magnitudes of 4 different types, that is, astigmatism at θ=0 degrees, 45 degrees, 90 degrees and 135 degrees, are used. It should be noted, however, that the angle θ does not have to be the 4 directions provided that the astigmatism direction α and the astigmatism magnitude δ are known. Directional astigmatism magnitudes dθ(f) at any arbitrary number of angles θ in at least 3 directions can be used. For each angle θ, the center position pθ of the curve dθ(f) is found. Then, the amplitude and a phase of a sinusoidal wave for the center position pθ are found as an astigmatism magnitude δ and an astigmatism phase α respectively. It should be noted that the waveform does not have to be sinusoidal. Instead, an almost sinusoidal waveform can be used.

The following description explains embodiments each used for finding directional sharpness magnitudes of a particle image in the astigmatism and focus correction quantity computation image processing circuit 53.

As a first embodiment, the particle detector 16 is used for detecting and observing a particle image by radiating a charged particle beam to a sample (target) 62 for automatic astigmatism correction based on a pattern with a direction varying from area to area as shown in FIG. 7(a) in a scanning operation. The directional sharpness magnitude dθ is found by measuring the amplitude of a particle image in each of the areas. The amplitude can be found by calculating the difference between the maximum value of s (x, y) and the minimum value of s (x, y) for each of the areas, or by calculating the differential ($V=\Sigma_{xy}$ (s (x, y)−smean)$^2$/N) of the concentration value (or the gradation value) s (x, y) of the particle image for each of the areas. As an alternative, the sum $\Sigma_{xy}$|t (x, y)| where |t (x, y)| is the absolute value of a differential t (x, y) of a 2 dimensional differential result s (x, y) of typically Laplacian and the sum of squares $\Sigma_{xy}$ (t (x, y)$^2$ are found. The sum found in this way is defined as a directional sharpness magnitude dθ. The angular direction θ can be defined in any arbitrary way. In the case of the example shown in the figure, the angular direction θ is defined in a clockwise direction starting at 0 degrees for the orientation of the direction of the normal line of the pattern coinciding with the horizontal direction. Directions of the pattern are not restricted to the 4 directions shown in the figure. Instead, the angle range of 180 degrees can be divided into n almost equal segments and pattern directions can then be determined by possible combinations of any of the n segments where n is an integer equal to or greater than 3.

A second embodiment implements a sample 20 or a calibration target 62 with a pattern like one shown in FIG.

7(b), and finds the directional sharpness magnitude dθ by calculating directional differentials for a particle image detected by the particle detector 16. A directional differentiation is implemented by carrying out convolution processing for an image on a mask like one shown in the figure. Then, a sum of squares of values at points for an image obtained as a result of the differentiation is computed as a directional sharpness magnitude dθ. It should be noted that the differentiation mask shown in the figure is typical. That is, the use of this mask is not mandatory. Any mask can be used as long as a requirement for a mask used for computing directional differentials is satisfied. The requirement is that 2 values at any 2 positions symmetrical with respect to a certain axis have signs opposite to each other but about equal magnitudes. There are a variety of achievable differentiation mask variations for suppressing noise and improving selectability of the differentiation direction. In addition, it is also necessary to select a filtering means prior to computation of image differentials and a means for shrinking the image. The selected means are means suitable for the image. Furthermore, by carrying out a directional differentiation after rotation of the image, a simple 0 degree differentiation or a 90 degree differentiation can also be adopted to perform a directional differentiation at any arbitrary directional angle θ.

The following description explains an embodiment for finding the center position pθ for a directional sharpness magnitude expressed as a function dθ($f$) of focal point f in the astigmatism and focus correction quantity computation image processing circuit 53. As a technique for finding the center position pθ, a proper method can be selected. The selected method can be a technique for finding the center position pθ as a center position of a function such as a second order function or a Gaussian function applied to values preceding and succeeding the position of the focal point f giving a maximum value of the function dθ($f$). Another selected method can be a technique for finding the center position pθ as a center of gravity for points at which the values of the function dθ($f$) are than greater than a threshold value.

The following description explains an embodiment for finding the astigmatism correction quantity in the whole control unit 26 from information on the astigmatism received from the astigmatism and focus correction quantity computation image processing circuit 53. When the 4 directions p0, p45, p90 and p135 at angles 0 degrees, 45 degrees, 90 degrees and 135 degrees respectively are used, the astigmatism and focus correction quantity computation image processing circuit 53 computes the astigmatism vector (dx, dy)=(p0−p90, p45−p135) and supplies the astigmatism vector to the whole control unit 26. Next, the whole control unit 26 apportions the astigmatism vector to the astigmatism correction quantities Δstx and Δsty in accordance with Eq. (4) as follows:

$$\Delta stx = mxx \cdot dx + mxy \cdot dy$$

$$\Delta sty = myx \cdot dx + myy \cdot dy \qquad (4)$$

where mxx, mxy, myx and myy are astigmatism correction quantity apportioning parameters computed in advance on the basis of a characteristic of the astigmatism corrector 60 and stored typically in the storage unit 57. The astigmatism adjustment unit 64 passes on the astigmatism correction quantities Δstx and Δsty received from the whole control unit 26 to the astigmatism adjustment circuit 61, requesting the astigmatism adjustment circuit 61 that the astigmatism correction quantities Δstx and Δsty be changed by β Δstx and β Δsty where notation β denotes a correction quantity reduction coefficient. In response to such a request, the astigmatism adjustment circuit 61 requests the astigmatism corrector 60 to change the astigmatism correction quantities Δstx and Δsty by β Δstx and β Δsty.

In the whole control unit 26, a focal point correction quantity is set at (p0+p45+p90+p135)/4 due to the fact that the focal offset z received from the astigmatism and focus correction quantity computation image processing circuit 53 is an average value of focal positions in the respective directions. Thus, the astigmatism adjustment unit 64 passes on the focal point correction quantity received from the whole control unit 26 typically to the focal position control unit 22. The focal position control unit 22 then corrects the objective lens 18 by the focal point correction quantity.

It should be noted that another embodiment is achievable. In this alternative embodiment, the astigmatism and focus correction quantity computation image processing circuit 53 finds the astigmatism magnitude δ=|(dx, dy)| and the astigmatism direction α=½ arctan (dy/dx) from the astigmatism vector (dx, dy) and supplies the astigmatism magnitude δ and the astigmatism direction α to the whole control unit 26. The whole control unit 26 then converts the astigmatism magnitude δ and the astigmatism direction α into astigmatism correction quantities Δstx and Δsty.

When directional sharpness magnitudes pθ in n directions are used where n is an integer equal to or greater than 3, the astigmatism and focus correction quantity computation image processing circuit 53 applies a sinusoidal waveform to these pieces of data to find the astigmatism magnitude δ, the astigmatism direction α and the focal offset z from a phase, an amplitude and an offset thereof.

If the astigmatism correction quantities are changed, the focal point may be affected by the changes, hence, being shifted slightly. In this case, typically, the whole control unit 26 multiplies the astigmatism correction quantities Δstx and Δsty by their respective proper coefficients and uses the products obtained as changes in astigmatism correction quantities Δstx and Δsty.

Figure 8:
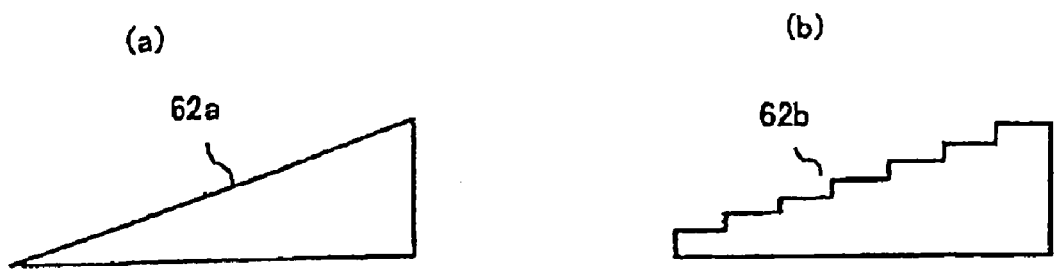
FIG. 8 illustrates a diagram showing shapes of a calibration target or a sample for calibration of astigmatism and a focal point at a relatively high speed.
Figure 9:
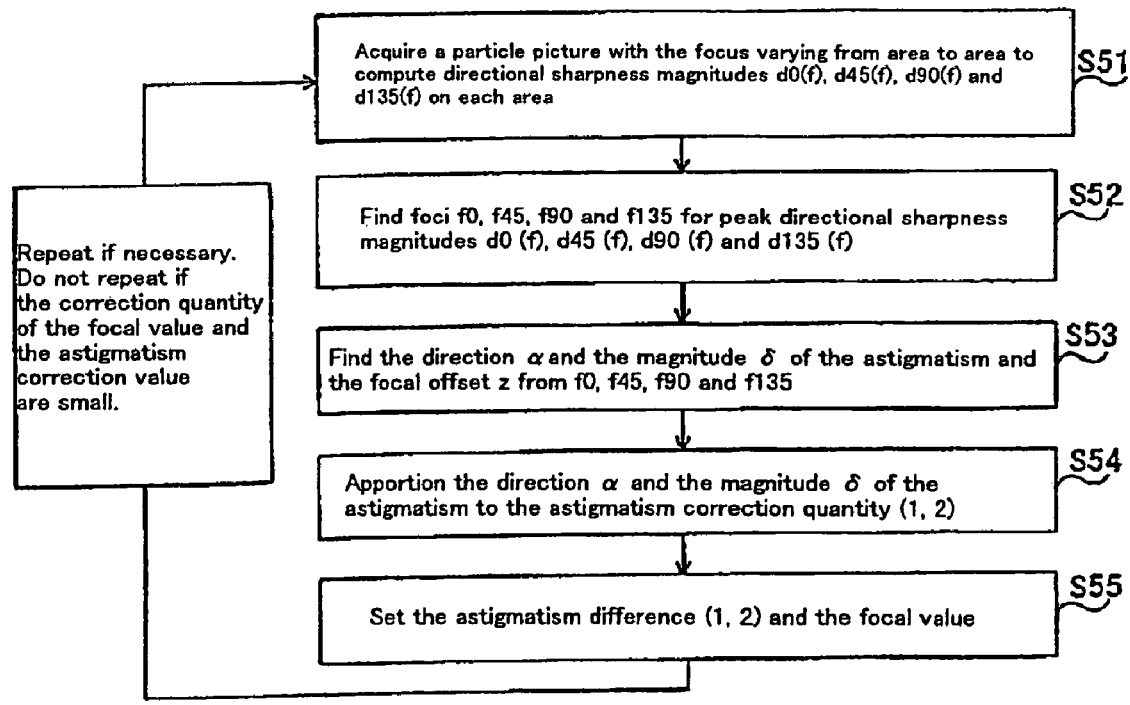
FIG. 9 illustrates a flowchart of representative image processing executed by the astigmatism and focal point correction quantity computation circuit employed in the charged particle beam apparatus shown in FIG. 1 and using the calibration target shown in FIG. 8 in a particular embodiment according to the present invention.
Figure 10:
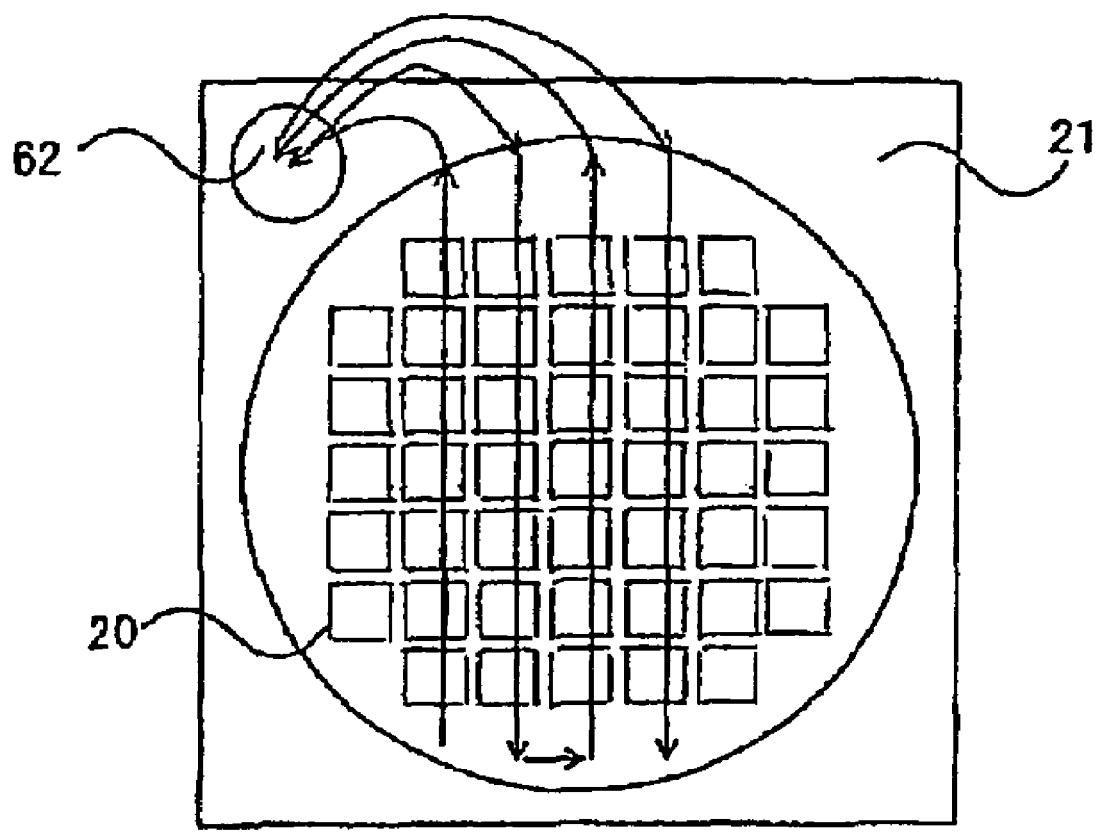
FIG. 10 illustrates a diagram showing a representative visual field movement sequence for periodically calibrating drifts of astigmatism and a focal point in a particular embodiment according to the present invention.

The following description explains another embodiment of the present invention for correcting the astigmatism and the focal point at an even higher speed by referring to FIGS. 8 and 9. In this embodiment, the surface of the calibration target 62 is inclined as shown in FIG. 8(a) or has a staircase like shape as shown in FIG. 8(b). Reference numerals 62a and 62b denote the former and latter calibration targets respectively which each have a proper pattern created on the surface thereof. The calibration target 62a or 62b is placed on the sample base 21 as shown in FIGS. 1 and 10. Thus, a particle image of the calibration target 62a or 62b which also serves as a sample has a focal point f varying from area to area. It should be noted that the difference in height between a reference point on the calibration target 62a or 62b and the surface of the sample 20 is measured in advance. A technique for automatically correcting a height for both the calibration target 62 and the sample 20, and a technique for measurement using an optical height sensor to be described later.

By using the calibration target 62a or 62b shown in FIG. 8(a) or 8(b) respectively, it is possible to obtain a particle image that has a focus f varying from area to area. Thus, a flowchart shown in FIG. 9 is different from the flowchart shown in FIG. 5 in that a particle image obtained at a step S51' of the former has a height (or a focus f) varying from area to area and includes edge components of about equal quantities in at least 3 directions. At the same step, directional sharpness magnitudes pθ(f) of such a particle image in the directions are computed. Thereafter, the quantities for correcting the astigmatism and the focal point are found to be used in an adjustment of the astigmatism and the focal point in the same way as the steps S52 to S55 of the flowchart shown in FIG. 5. In this way, by acquiring only 1 particle image, the astigmatism and the focal point can be corrected at a relatively high speed.

In addition, the same effect as that of the embodiment described above can be obtained by using a flat surface calibration target 62 or a flat surface sample 20. In the case of such a calibration target 62 or such a sample 20, a particle image is taken while the focal point is being changed at a relatively high speed. In this way, it is possible to obtain an image with a focal point varying from area to area as is the case with the embodiment described above. As a result, by acquiring only 1 particle image, the astigmatism and the focal point can be corrected at a relatively high speed.

The following description explains a relation between inspections or measurements of a substrate and astigmatism and focal point corrections. The actual sample 20 serving as a substrate subjected to an inspection or a measurement is mounted on the sample base 21. Then, at least information on a predetermined position on the object substrate 20 is supplied to the whole control unit 26 by using an input means 59 to be stored in the whole control unit 26. The predetermined position reported to the whole control unit 26 is a position subjected to an inspection or a measurement. The input means 59 is typically a recording medium or a network. Thus, when the inspection or the measurement of the object substrate 20 is implemented, the XY stage 46 is controlled by a command issued by the whole control unit 26 to take the predetermined position on the object substrate 20 into the visual field of the charged particle optical system. Subsequently, a charged particle beam is radiated onto the surface of the object substrate 20 to carry out a scanning operation and a particle image obtained as a result of the radiation is detected by the particle detector 16. The particle image is then subjected to A/D conversion before being stored in the image memory 55. Then, the inspection and measurement image processing circuit 56 processes the particle image in order to carry out the inspection or the measurement. At that time, at the position subjected to the inspection or the measurement, the astigmatism and the focal position are corrected by using the method provided by the present invention. As a result, it is possible to carry out an inspection or a measurement based on a particle image with the astigmatism thereof always corrected.

In the case of an inspection and measurement apparatus provided with typically an optical height detection sensor 13 wherein the object substrate is affected by electric charge, dirt, a damage or the like only slightly, a converged charged particle beam is radiated to the sample 20 in a scanning operation for an inspection or a measurement instead of using a height detected by the optical height detection sensor 13 at each position on the sample 20 subjected to the inspection or the measurement as feedback information in the processing of the focal point and radiating the converged charged particle beam in a scanning operation for an adjustment of the focal point and the astigmatism. Thus, the effect of electric charge, dirt, a damage or the like only on the object substrate 20 or the sample 20 can be suppressed to a minimum. In this case, the astigmatism and the focal point are automatically adjusted by using a separate position on the sample 20 or the calibration target 62 provided on the sample base 21. The automatic adjustment is carried out in advance or periodically in the course of the inspection or the measurement. Further, the calibration target 62 can be a sample having an inclined or staircase like surface shown in FIG. 8 or a sample having a flat surface as shown in FIG. 1.

In the automatic adjustment of the astigmatism and the focal point according to the present invention as described above, shifts of the focal point and the astigmatism which occur with the lapse of time are corrected. In the automatic adjustment of the astigmatism and the focal point according to the present invention, however, it is necessary to adjust a detected offset with the optical height detection sensor 13 in advance. Differences in height or variances in height among positions on the actual sample 20 or the object substrate 20 are detected by the optical height detection sensor 13 in the correction of the focal point. Thus, only during an inspection or a measurement is an astigmatism free converged charged particle beam radiated to the actual sample 20 in an in focus state in a scanning operation. Therefore, a particle image can be detected in a state where the effect of electric charge, dirt, a damage or the like only on the actual sample 20 can be suppressed to a minimum. As a result, the object substrate 20 can be inspected or measured with a relatively high degree of precision.

In addition, when it is desired to calibrate not only an offset between the optical height detection sensor 13 and the focal position control unit 22, but also the gain, a plurality of calibration targets 62 with their heights known are provided in advance. Then, an automatic correction of the focal point and a detection by using the optical height detection sensor 13 are both carried out on each of the calibration targets 62 in order to calibrate the gain and even linearity. Furthermore, an automatic correction of the focal point and a detection by using the optical height detection sensor 13 can both be carried out on each of the calibration targets 61 or the samples 20 while the height of the calibration target 61 or the sample 20 is being varied by using the Z shaft of the XY stage 46 in order to calibrate the gain and even the linearity.

Moreover, while the XY stage 46 is being moved continuously in the horizontal direction as shown in FIG. 10, the beam deflector 15 is driven to radiate a converged charged particle beam in a scanning operation in a direction crossing the moving direction of the XY stage 46 almost perpendicularly in particular to allow the particle detector 16 to continuously detect a particle image. In an inspection or a measurement carried out at a relatively high speed, the control described below is executed. A height detected by the optical height detection sensor 13 is fed back to the focal position control unit 22 and the deflection control unit 47 all the time. By doing so, while a shift of the focal point and a rotation of the deflection are being corrected all the time, a particle image is detected. It is thus possible to implement a relatively high speed inspection or a relatively high speed measurement with a relatively high degree of precision over the entire surface of the actual sample 20. It should be noted that, instead of driving the focal position control unit 22 to correct the focal point, the Z shaft of the XY stage 46 can of course be driven to result in the same effects. In the mean time, the operation is shifted to the calibration target 62 periodically as shown in FIG. 10 to automatically correct the focal point and the astigmatism. It is thus possible to carry out a relatively high precision and high sensitivity inspection or a relatively high precision and high sensitivity measurement based on a particle image with the focal point and the astigmatism thereof corrected with a relatively high degree of precision.

Figure 11:
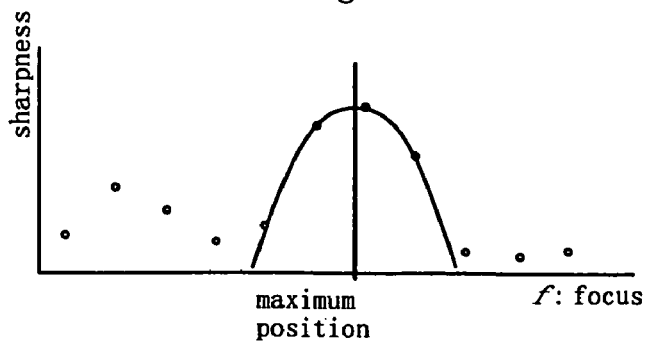
FIG. 11 illustrates a diagram showing a technique of interpolation of a maximum value position of a curve representing the directional sharpness magnitude in a particular embodiment according to the present invention.

The following description explains a method of finding the center position of an area under a curve representing the directional sharpness magnitude wherein a function having a peak such as a quadratic function or a Gaussian function is used to represent the curve with reference to FIG. 11. As shown in the figure, a point at which a maximum value of the sharpness magnitude is located is found. Then, a convex function such as a quadratic function or a Gaussian function is applied to N data points preceding and succeeding the maximum value point. For N=3, it is possible to find such parameters that all the data points are placed on the curve of the quadratic function or the Gaussian function. Thus, the center position of an area under the curve representing the directional sharpness magnitude can be found by interpolation.

By a maximum position or interpolation based on a maximum value position, however, an error will be generated particularly in the case of a large magnitude of astigmatism. This problem is shown in FIG. 12. Consider a sharpness magnitude in the 0 degree direction in a case in which astigmatism is generated in the approximately ±45 degree direction. Thus, if the spot of the charged particle beam is in an in focus state in the ±45 degree direction, the spot cross section length in the 0 degree direction is narrowed. In an in focus state, on the other hand, the spot cross section length in the 0 degree direction is widened. Generally, the narrower the spot cross section length in the 0 degree direction, the greater the sharpness magnitude. Thus, a sharpness quantity curve in a direction with no generated astigmatism tends to exhibit a double peaked characteristic for a large sharpness magnitude as is the case with d0 (f) and d90 (f) curves shown in FIG. 12(b). If an interpolation based only on a maximum value position is adopted in such a case, a one sided position like a point B shown in FIG. 12(c) will be determined to be the center position of the area under the curve representing the directional sharpness magnitude. In this case, a value close to the maximum p45 of the function d45 (f) is taken as the center of the area under the curve representing the function d0 (f). In the example of FIG. 12, when maximum position is used, p0 becomes very close to p45 and p90 becomes very close to p135. In this case, the estimated ±45 degree component of the astigmatic focus distance becomes twice as large as it should be. If this astigmatic focus distance is used for the astigmatic correction, the astigmatism in this direction is corrected too much, resulting in unstable behavior. In contrast, depending on the technique of searching for a maximum value, a point C representing the maximum value may be taken as the center of the area under the curve representing the function d0 (f). In this case, almost no correction occurs for astigmatism in the ±45 degree direction. In order to find the astigmatism magnitude and the astigmatism direction correctly as explained earlier by referring to FIG. 6, however, it is necessary to determine a middle point between the points B and C such as a point A shown in FIG. 12(c) as the center of the area under the curve representing the function d0 (f).

As described above, in select embodiments according to the present invention, a point between the points B and C is found as the center of the area under the curve representing the astigmatism magnitude in dependence on the sizes of the peaks of the points B and C. There are a variety of techniques of determining such a middle point. Some embodiments implementing these techniques are explained as follows. It should be noted that the scope of the present invention is not limited to described embodiments. That is, the scope of the present invention includes the use of any technique to find a middle value in accordance with the sizes of the peaks.

Figure 13:
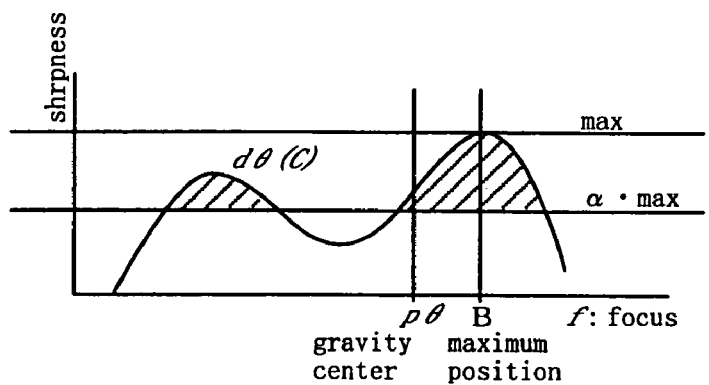
FIG. 13 illustrates a diagram showing a technique of finding a center of gravity as a center position of a curve representing the directional sharpness magnitude in a particular embodiment according to the present invention.

FIG. 13 is an explanatory diagram showing a technique based on the center of gravity. According to this technique, a maximum value is found. Then, the maximum value is multiplied by a constant, α, equal to or smaller than 1, resulting in a product that can be used as a threshold value. The center of gravity of an area enclosed by a segment of a curve and a line representing the threshold value is then determined, where the curve represents variations in directional sharpness magnitude with the focal point position and the segment represents points on the curve each having a value greater than the threshold value. The center of gravity is used as the center of the area under the curve representing the directional sharpness magnitude.

That is, the center pθ of the area under the curve representing the directional sharpness magnitude is found in accordance with the following equation:

$$p\theta = \frac{\sum f \cdot (d\theta(f) - \alpha \cdot MaximumValue)}{\sum d \cdot (d\theta(f) - \alpha \cdot MaximumValue)}$$

Figure 14:
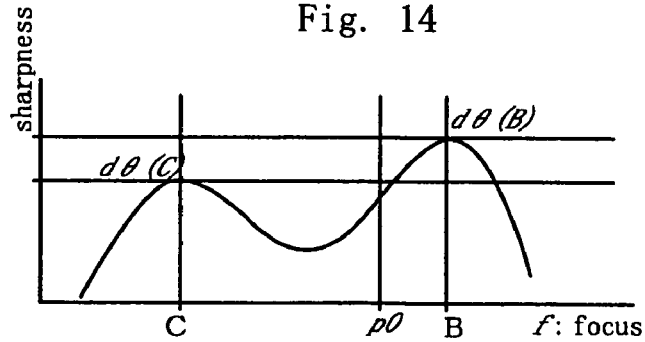
FIG. 14 illustrates a diagram showing a technique of computing a weighted average of positions of maximum values as a center position of a curve representing the directional sharpness magnitude in a particular embodiment according to the present invention.

FIG. 14 is a diagram showing a technique based on a weighted average. If there are a plurality of maximum values for a directional sharpness magnitude, peak positions of the maximum values are found and a weighted average value of the peak positions is computed with weights determined in accordance with the heights of the maximum value points at the peak positions. The weighted average is used as the center of the area under the curve representing the directional sharpness magnitude. Let notations B and C denote the positions of maximum values. In this case, the center pθ of the area under the curve representing the directional sharpness magnitude is computed in accordance with the following equation:

$$p\theta = \frac{(d\theta(c) \cdot B + d\theta(B) \cdot C)}{(d\theta(C) + d\theta(B))}$$

Figure 15:
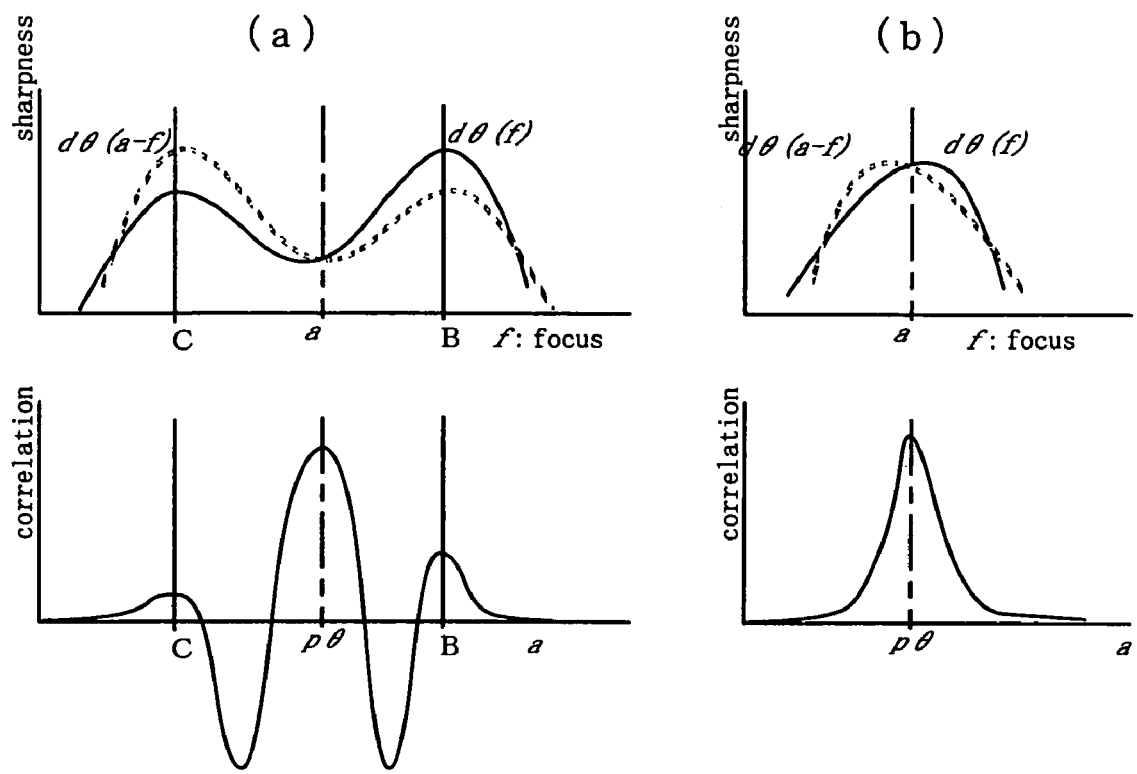
FIG. 15 illustrates a diagram showing a technique of finding a center position of a curve representing the directional sharpness magnitude by symmetry matching in a particular embodiment according to the present invention.

FIG. 15 is a diagram showing a technique based on symmetry matching. In accordance with this technique, variations in degree of matching with pθ are found. The degree of matching represents coincidence between a curve dθ(f) representing variations in directional sharpness magnitude with the focal point position and a curve dθ(α−f) of image inversion symmetrical with respect to an axis of symmetry f=a on the left and right sides of the axis of symmetry f=a. The position a of an axis of symmetry providing the highest degree of coincidence is determined as the in focus position pθ. As a degree of coincidence, a point of a maximum correlation value can also be used. As an alternative, a point providing a minimum sum of squares of differences can also be used as a degree of coincidence. Many other indicators generally used as an indicator of the degree of coincidence can be used. The embodiments described above are used for exemplifying a case in which a charged particle beam apparatus is applied to an inspection and measurement apparatus.

It should be noted, however, that the techniques described herein with respect to the example of a charged particle beam apparatus can also be applied to other equipment such as a fabrication apparatus using a charged particle beam.

The preceding has been a description of the preferred embodiment of the invention. It will be appreciated that deviations and modifications can be made without departing from the scope of the invention, which is defined by the appended claims.

The preceding has been a description of the preferred embodiment of the invention. It will be appreciated that deviations and modifications can be made without departing from the scope of the invention, which is defined by the appended claims.

What is claimed is:

1. A charged particle beam apparatus comprising:
    a stage on which a sample is mounted and movable at least in one direction;
    a charged particle optical unit for converging a charged particle beam emitted by a charged particle source;
    a scanning unit for irradiating and scanning said charged particle beam converged by said charged particle optical unit onto said sample;
    a focal point control unit for controlling a focal point of said charged particle beam converged by said charged particle optical system;
    an astigmatism adjustment unit for adjusting astigmatism of said charged particle beam converged by said charged particle optical system;
    a height detection unit for optically detecting a height of a surface of said sample mounted on said stage;
    an image detection unit for obtaining an image of said sample by detecting particles generated from said sample by the radiation of said charged particle beam converged by said charged particle optical unit;
    an image processing unit for computing a focal offset and said astigmatism of said converged charged particle beam on the basis of said detected image obtained by said image detection unit; and
    a control system for adjusting and controlling said astigmatism of said converged charged particle beam by feeding back an astigmatism correction quantity to said astigmatism adjustment unit based on said astigmatism computed by said image processing unit.

2. A charged particle beam apparatus according to the claim 1, wherein said stage mounts a specimen and said height detection unit detects a height of the surface of the specimen while moving at least in one direction by the movement of said stage.

3. A charged particle beam apparatus according to the claim 1, wherein said stage mounts a specimen and said control system further controls said focal point control unit to control the focal point of said charged particle beam while said stage is moving at least in one direction by using information of a height of the surface of the specimen detected by said height detection unit.

4. A charged particle beam apparatus according to the claim 1, wherein said particle image detection unit detects a plurality of images at different focal point positions by controlling said focal point control unit.

5. A method for detecting an image of a sample, comprising:
    setting a specimen on a table on which a sample is mounted and said table is movable at least in one direction;
    converging a charged particle beam emitted from a charged particle source;
    irradiating and scanning said converged charged particle beam onto a surface of said sample mounted on said stage;
    detecting a plurality of images of said sample by detecting particles generated from said sample by the irradiation and scanning of said converged charged particle beam by changing focal positions of said converged charged particle beam;
    computing an astigmatism correction quantity and a focal point correction quantity based on a focal offset and astigmatism of said converged charged particle beam obtained by processing said plurality of detected images;
    adjusting said astigmatism of said converged charged particle beam based on said computed astigmatism correction quantity;
    adjusting said focal point of said converged charged particle beam based on said computed focal point correction quantity;
    irradiating and scanning said converged charged particle beam onto a surface of said specimen set on said stage;
    optically detecting a height of the surface of said specimen which is moving at least in one direction by the movement of said table and irradiated and scanned by said converged charged particle beam;
    controlling said focal point of said converged charged particle beam based on said computed focal point correction quantity and said optically detected height of the surface of said specimen on which said converged charged particle beam is irradiated and scanned; and
    continuously detecting images of said specimen by the irradiation and scanning of said converged charged particle beam the focal point of which is controlled by the step of said controlling while said sample is moving at least in one direction by the movement of said table.

6. A method according to the claim 5, wherein said focal offset of said converged charged particle beam is obtained from information of directional sharpness magnitudes for at least 3 directions for a plurality of focal positions from said plurality of detected images.

7. A method according to the claim 6, wherein said astigmatism of said converged charged particle beam is obtained from a relation among said focal offset and said directional sharpness magnitudes for at least 3 directions.

8. A method for detecting an image of a sample, comprising:
    setting a specimen on a table on which a sample is mounted and said table is movable at least in one direction;
    irradiating and scanning a converged electron beam onto a surface of said specimen mounted on said stage;
    optically detecting a height of the surface of said specimen which is irradiated and scanned by said converged electron beam;
    controlling said focal point of said converged electron beam using information of optically detected height of the surface of said specimen; and
    detecting a secondary electron generated from said specimen by the irradiation and scanning of the converged electron beam,
    wherein a focal offset and an astigmatism of said converged electron beam is controlled based on a focal offset correction quantity and an astigmatism correction quantity computed from plural secondary electron images formed by detecting a secondary electron generated by irradiating and scanning said converged electron beam on said sample mounted on said stage by changing focal positions of said electron beam.

9. A method according to the claim 8, wherein said stage is moving in one direction while irradiating and scanning a converged electron beam onto a surface of said specimen and optically detecting a height of the surface of said specimen.

10. A method according to the claim 8, wherein said focal offset of said converged electron beam is obtained from information of directional sharpness magnitudes for at least 3 directions for a plurality of focal positions from said plurality of detected images.

* * * * *